(12) United States Patent
Kusunoki et al.

(10) Patent No.: US 10,179,840 B2
(45) Date of Patent: Jan. 15, 2019

(54) CONDENSATION CURABLE RESIN COMPOSITION AND SEMICONDUCTOR PACKAGE

(71) Applicant: Shin-Etsu Chemical Co., Ltd., Tokyo (JP)

(72) Inventors: Takayuki Kusunoki, Annaka (JP); Yuusuke Takamizawa, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 94 days.

(21) Appl. No.: 15/495,221

(22) Filed: Apr. 24, 2017

(65) Prior Publication Data

US 2017/0306098 A1 Oct. 26, 2017

(30) Foreign Application Priority Data

Apr. 25, 2016 (JP) ................. 2016-087163

(51) Int. Cl.
*C08G 77/18* (2006.01)
*H01L 23/29* (2006.01)
*C08G 77/12* (2006.01)
*H01L 33/56* (2010.01)
*C08G 77/52* (2006.01)
*C08G 77/16* (2006.01)

(52) U.S. Cl.
CPC ............. *C08G 77/18* (2013.01); *C08G 77/12* (2013.01); *H01L 23/296* (2013.01); *H01L 33/56* (2013.01); *C08G 77/16* (2013.01); *C08G 77/52* (2013.01)

(58) Field of Classification Search
CPC ......... C08G 77/12; C08G 77/18; H01L 33/56; H01L 23/296
USPC ............................................ 528/31
See application file for complete search history.

(56) References Cited

U.S. PATENT DOCUMENTS

| 4,463,118 A * | 7/1984 | Evans .................... C08L 83/10 524/264 |
| 6,368,535 B1 | 4/2002 | Katsoulis et al. |
| 7,176,270 B2 | 2/2007 | Tabei |
| 7,550,204 B2 | 6/2009 | Shimizu et al. |
| 2011/0278640 A1* | 11/2011 | Motallebi ............... H01L 33/56 257/100 |
| 2014/0051806 A1* | 2/2014 | Kato ...................... C09J 183/06 524/866 |
| 2014/0213809 A1* | 7/2014 | Kusunoki ............... C07F 7/188 556/451 |
| 2016/0266490 A1* | 9/2016 | Yoshida ............... C09D 183/14 |

FOREIGN PATENT DOCUMENTS

| EP | 1 074 574 A1 | 2/2001 |
| EP | 1 780 242 A2 | 5/2007 |
| JP | 2001-64393 A | 3/2001 |
| JP | 2005-133073 A | 5/2005 |
| JP | 4781780 B2 | 9/2011 |
| JP | 4788837 B2 | 10/2011 |
| JP | 2011-219729 A | 11/2011 |
| JP | 2012-111850 A | 6/2012 |
| JP | 2012-251058 A | 12/2012 |

* cited by examiner

*Primary Examiner* — Marc S Zimmer
(74) *Attorney, Agent, or Firm* — Birch, Stewart, Kolasch & Birch, LLP

(57) ABSTRACT

A resin composition comprising (A) a silphenylene skeleton-bearing organosilicon compound containing at least two hydroxyl and/or alkoxy groups per molecule and (B) an organosilicon compound having a hydrogen atom and a hydroxyl and/or alkoxy group on a common silicon atom, or comprising (C) a silphenylene skeleton-bearing organosilicon compound having a hydrogen atom and a hydroxyl and/or alkoxy group on a common silicon atom is condensation curable without a need for catalysts. The cured product has satisfactory hardness, crack resistance, heat resistance and light resistance.

5 Claims, No Drawings

CONDENSATION CURABLE RESIN COMPOSITION AND SEMICONDUCTOR PACKAGE

CROSS-REFERENCE TO RELATED APPLICATION

This non-provisional application claims priority under 35 U.S.C. § 119(a) on Patent Application No. 2016-087163 filed in Japan on Apr. 25, 2016, the entire contents of which are hereby incorporated by reference.

TECHNICAL FIELD

This invention relates to a condensation curable resin composition, especially comprising an organosilicon compound bearing a silphenylene skeleton within the molecule, and a semiconductor package encapsulated with the cured composition.

BACKGROUND ART

From the past, condensation curable silicone resin compositions are used as encapsulant for semiconductor chips such as LED because of excellent heat resistance and light resistance. For example, Patent Document 1 describes a condensation curable silicone resin composition which is resistant to sulfide and effective for the protection of bottom silver surface in LED packages. Patent Document 2 describes a condensation curable silicone resin composition having improved adhesion to adherends.

Although condensation curable silicone resin compositions are widely used as the semiconductor encapsulant, their properties are still below the satisfactory level. In particular, LED encapsulants are exposed to not only internal stresses by temperature changes associated with on/off operation of optical semiconductor devices, but also external stresses by changes of ambient temperature and humidity. For the LED encapsulants, crack resistance is quite important. However, silicone resins obtained by curing prior art condensation curable silicone resin compositions do not withstand stresses by temperature changes, i.e., have poor crack resistance. In general, a countermeasure taken in silicone resin for the purpose of improving crack resistance is by reducing the hardness of resin to make the resin softer so that the stress may be mitigated. However, once the silicone resin is softened, another problem arises that the resin is deformable in shape and sticky on its surface. Such resin products are difficult to handle. Their gas barrier properties are degraded, and LED protection ability is reduced.

For imparting toughness to a cured silicone resin while maintaining hardness, an attempt to incorporate a silphenylene skeleton into a silicone resin is made in Patent Documents 3 and 4. As compared with the general method of establishing a high hardness by increasing the crosslinking density of silicone resin, this method establishes a high hardness by incorporating a silphenylene skeleton into a silicone resin to restrain motion of the polymer chain. The resulting resin has rigidity and hardness. While the method of increasing the crosslinking density generally makes the resin brittle, the method of incorporating a silphenylene skeleton is advantageous in that the resin exerts a toughness without embrittlement because the silphenylene skeleton is linear.

When silicone resins are used as LED encapsulants, not only crack resistance, but also curing rate, heat resistance and light resistance are important. As compared with addition curable polyorganosiloxane compositions, condensation curable polyorganosiloxane compositions have low reactivity and low productivity. If a large amount of condensation catalyst is added to such a silicone resin to increase the reactivity, the silicone resin is degraded in an accelerated manner, failing to exert the silicone resin's own heat resistance and light resistance. Additionally, many catalysts are inadequate in the field requiring transparency because some catalysts themselves are colored or the resin is colored with the progress of degradation.

Regarding the modification and practical utilization of condensation curable polyorganosiloxane compositions, a variety of attempts have been made. For example, Patent Document 5 proposes to add a metal catalyst of aluminum or zinc and a condensation catalyst selected from phosphates and boron compounds to a polyorganosiloxane having at least two silanol groups per molecule and a polyorganosiloxane having at least two silicon-bonded alkoxy groups per molecule for thereby increasing a curing rate and minimizing resin degradation. Also Patent Document 6 discloses an attempt to combine addition cure with condensation cure to compensate for mutual shortcomings by introducing silanol and alkoxy groups into an addition curable polyorganosiloxane composition having alkenyl and hydrosilyl groups. Further Patent Document 7 describes an attempt in which a condensation curable polyorganosiloxane composition is previously converted to a higher molecular weight one whereby gelation is achieved within a smaller number of reactions.

CITATION LIST

Patent Document 1: JP-A 2012-251058
Patent Document 2: JP-A 2012-111850
Patent Document 3: JP-A 2001-064393 (U.S. Pat. No. 6,368,535, EP 1074574)
Patent Document 4: JP-A 2005-133073
Patent Document 5: JP-A 2011-219729
Patent Document 6: JP 4788837
Patent Document 7: JP 4781780 (U.S. Pat. No. 7,550,204, EP 1780242)

DISCLOSURE OF INVENTION

An object of the invention is to provide a condensation curable resin composition comprising a silphenylene skeleton-bearing organosilicon compound, which quickly cures, without a need for catalyst, into a product having a satisfactory hardness and crack resistance, and a semiconductor package encapsulated with the cured composition.

The inventors have found that the above and other objects are attained by a condensation curable resin composition comprising (A) a silphenylene skeleton-bearing organosilicon compound having at least two hydroxyl and/or alkoxy groups per molecule, represented by the general formula (1) and (B) an organosilicon compound having a hydrogen atom and a hydroxyl and/or alkoxy group on a common silicon atom, represented by the general formula (3), or a condensation curable resin composition comprising (C) a silphenylene skeleton-bearing organosilicon compound having a hydrogen atom and a hydroxyl and/or alkoxy group on a common silicon atom, represented by the general formula (4), the composition being free of a condensation catalyst. The formulae (1), (3) and (4) are as defined below. The resin composition has a satisfactory curing rate and cures into a product having a good profile of hardness, crack resistance, heat resistance and light resistance.

Accordingly, in one aspect, the invention provides a condensation curable resin composition comprising:

(A) 100 parts by weight of a silphenylene skeleton-bearing organosilicon compound containing at least two hydroxyl and/or alkoxy groups per molecule, represented by the general formula (1):

$$(R^1{}_3SiO_{0.5})_a(R^1{}_2SiO)_b(R^2SiO_{1.5})_c(SiO_2)_dZ_e(O_{0.5}X)_f \qquad (1)$$

wherein $R^1$ is independently hydrogen or a $C_1$-$C_{12}$ unsubstituted monovalent hydrocarbon group, $R^2$ is independently a $C_1$-$C_{12}$ unsubstituted monovalent hydrocarbon group, Z is independently a group having the formula (2):

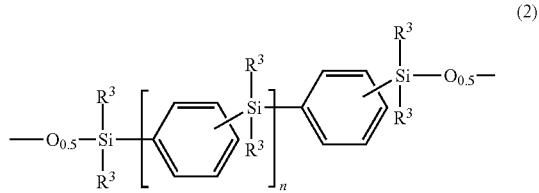

wherein $R^3$ is independently a $C_1$-$C_{12}$ unsubstituted monovalent hydrocarbon group, and n is an integer of 0 to 3, X is independently hydrogen or a $C_1$-$C_6$ unsubstituted monovalent hydrocarbon group, a is an integer of 0 to 500, b is an integer of 0 to 5,000, c is an integer of 0 to 500, d is an integer of 0 to 500, e is an integer of 1 to 500, f is an integer of 2 to 100, and a+b+c+d+e is an integer of 1 to 5,001, and (B) 0.1 to 200 parts by weight of an organosilicon compound having a hydrogen atom and a hydroxyl and/or alkoxy group on a common silicon atom, represented by the general formula (3):

$$(R^1{}_3SiO_{0.5})_{a'}(R^4{}_2SiO)_{b'}(R^2SiO_{1.5})_{c'}(SiO_2)_{d'}Z_{e'}(O_{0.5}X)_{f'}(R^1{}_kHSi(OX)_{2-k}O_{0.5})_{g'} \qquad (3)$$

wherein $R^1$, $R^2$, Z and X are as defined above, $R^4$ is hydrogen, a $C_1$-$C_{12}$ unsubstituted monovalent hydrocarbon group or OX, a' is an integer of 0 to 500, b' is an integer of 0 to 5,000, c' is an integer of 0 to 500, d' is an integer of 0 to 500, e' is an integer of 0 to 500, f' is an integer of 0 to 100, g' is an integer of 2 to 100, k is 0 or 1, and a'+b'+c'+d'+e'+g' is an integer of 2 to 5,002, the composition being free of a condensation catalyst.

In another aspect, the invention provides a condensation curable resin composition comprising (C) a silphenylene skeleton-bearing organosilicon compound having a hydrogen atom and a hydroxyl and/or alkoxy group on a common silicon atom, represented by the general formula (4):

$$(R^1{}_3SiO_{0.5})_{a''}(R^4{}_2SiO)_{b''}(R^2SiO_{1.5})_{c''}(SiO_2)_{d''}Z_{e''}(O_{0.5}X)_{f''}(R^1{}_kHSi(OX)_{2-k}O_{0.5})_{g''} \qquad (4)$$

wherein $R^1$ is independently hydrogen or a $C_1$-$C_{12}$ unsubstituted monovalent hydrocarbon group, $R^2$ is independently a $C_1$-$C_{12}$ unsubstituted monovalent hydrocarbon group, Z is independently a group having the formula (2):

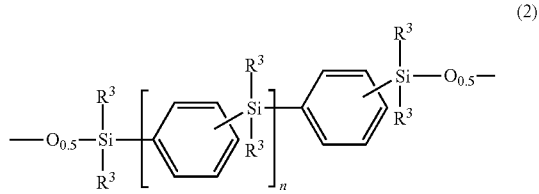

wherein $R^3$ is independently a $C_1$-$C_{12}$ unsubstituted monovalent hydrocarbon group, and n is an integer of 0 to 3, X is independently hydrogen or a $C_1$-$C_6$ unsubstituted monovalent hydrocarbon group, $R^4$ is hydrogen, a $C_1$-$C_{12}$ unsubstituted monovalent hydrocarbon group or OX, a'' is an integer of 0 to 500, b'' is an integer of 0 to 5,000, c'' is an integer of 0 to 500, d'' is an integer of 0 to 500, e'' is an integer of 1 to 500, f'' is an integer of 0 to 100, g'' is an integer of 2 to 100, k is 0 or 1, and a''+b''+c''+d''+e''+g'' is an integer of 3 to 5,003, the composition being free of a condensation catalyst.

In either embodiment, the composition may further comprise (D) an organosilicon compound having at least two hydrolyzable groups selected from acetoxy, ketoxime and alkenoxy groups per molecule or a partial hydrolyzate thereof, in an amount of 0.1 to 30 parts by weight per 100 parts by weight of components (A) and (B) combined or component (C).

The composition may further comprise (E) an organosilicon compound having at least two hydroxyl and/or alkoxy groups per molecule, represented by the general formula (6):

$$(R^1{}_3SiO_{0.5})_{a'''}(R^1{}_2SiO)_{b'''}(R^2SiO_{1.5})_{c'''}(SiO_2)_{d'''}(O_{0.5}X)_{f'''} \qquad (6)$$

wherein $R^1$, $R^2$ and X are as defined above, a''' is an integer of 0 to 500, b''' is an integer of 0 to 5,000, c''' is an integer of 0 to 500, d''' is an integer of 0 to 500, f''' is an integer of 2 to 100, and $1 \leq b'''+c'''+d''' \leq 5{,}000$, in an amount of 5 to 500 parts by weight per 100 parts by weight of components (A) and (B) combined or component (C).

Also contemplated herein is a semiconductor package encapsulated with a cured product of the condensation curable resin composition defined above.

Advantageous Effects of Invention

The condensation curable resin composition exhibits improved crack resistance by virtue of silphenylene skeleton involved therein. The composition is effectively curable without a need for catalyst and cures into a product having heat resistance and light resistance.

DESCRIPTION OF PREFERRED EMBODIMENTS

The notation (Cn-Cm) means a group containing from n to m carbon atoms per group.

One embodiment of the invention is a condensation curable resin composition essentially comprising components (A) and (B) whereas another embodiment of the invention is a condensation curable resin composition essentially comprising component (C). These embodiments are described in sequence.

Embodiment 1: Comprising Essential Components (A) and (B)

(A) Silphenylene Skeleton-Bearing Organosilicon Compound Containing at Least Two Hydroxyl and/or Alkoxy Groups Component (A) is a silphenylene skeleton-bearing organosilicon compound containing at least two hydroxyl and/or alkoxy groups per molecule, represented by the general formula (1).

$$(R^1{}_3SiO_{0.5})_a(R^1{}_2SiO)_b(R^2SiO_{1.5})_c(SiO_2)_dZ_e(O_{0.5}X)_f \qquad (1)$$

Herein $R^1$ is independently hydrogen or a $C_1$-$C_{12}$ unsubstituted monovalent hydrocarbon group, $R^2$ is independently a $C_1$-$C_{12}$ unsubstituted monovalent hydrocarbon group, Z is independently a group having the formula (2):

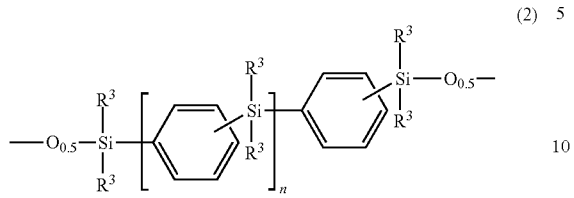
(2)

wherein $R^3$ is independently a $C_1$-$C_{12}$ unsubstituted monovalent hydrocarbon group, and n is an integer of 0 to 3, X is independently hydrogen or a $C_1$-$C_6$ unsubstituted monovalent hydrocarbon group, a is an integer of 0 to 500, b is an integer of 0 to 5,000, c is an integer of 0 to 500, d is an integer of 0 to 500, e is an integer of 1 to 500, 1 is an integer of 2 to 100, and a+b+c+d+e is an integer of 1 to 5,001.

In formula (1), $R^1$ is independently hydrogen or a $C_1$-$C_{12}$ unsubstituted monovalent hydrocarbon group. Examples include hydrogen, $C_1$-$C_{12}$ monovalent saturated aliphatic hydrocarbon groups, for example, alkyl groups such as methyl, ethyl, propyl, butyl and hexyl, and cycloalkyl groups such as cyclohexyl, and $C_6$-$C_{12}$ monovalent aromatic hydrocarbon groups, for example, aryl groups such as phenyl, tolyl, xylyl and naphthyl and aralkyl groups such as benzyl, phenylethyl and phenylpropyl. Inter alia, methyl and phenyl are preferred.

$R^2$ is independently a $C_1$-$C_{12}$ unsubstituted monovalent hydrocarbon group, examples of which are the same as exemplified above for $R^1$ (exclusive of hydrogen). Inter alia, methyl and phenyl are preferred.

X is independently hydrogen or a $C_1$-$C_6$ unsubstituted monovalent hydrocarbon group. Examples include hydrogen, $C_1$-$C_6$ monovalent saturated aliphatic hydrocarbon groups, for example, alkyl groups such as methyl, ethyl, propyl, butyl and hexyl, and cycloalkyl groups such as cyclohexyl, and phenyl. Inter alia, methyl and ethyl are preferred.

In formula (2), $R^3$ is independently a $C_1$-$C_{12}$ unsubstituted monovalent hydrocarbon group. Examples include $C_1$-$C_{12}$ monovalent saturated aliphatic hydrocarbon groups, for example, alkyl groups such as methyl, ethyl, propyl, butyl and hexyl, and cycloalkyl groups such as cyclohexyl, and $C_6$-$C_{12}$ monovalent aromatic hydrocarbon groups, for example, aryl groups such as phenyl, tolyl, xylyl and naphthyl and aralkyl groups such as benzyl, phenylethyl and phenylpropyl. Inter alia, methyl and phenyl are preferred.

In formula (1), a is an integer of 0 to 500, preferably 0 to 250, and more preferably 0 to 100; b is an integer of 0 to 5,000, preferably 0 to 2,500, and more preferably 0 to 1,000; c is an integer of 0 to 500, preferably 0 to 250, and more preferably 0 to 100; d is an integer of 0 to 500, preferably 0 to 250, and more preferably 0 to 100; e is an integer of 1 to 500, preferably 1 to 250, and more preferably 1 to 100; f is an integer of 2 to 100, preferably 2 to 75, and more preferably 2 to 50; and a+b+c+d+e is an integer of 1 to 5,001, preferably 1 to 4,000, and more preferably 1 to 2,500.

In formula (2), n is an integer of 0 to 3, preferably 0 or 1, and most preferably 1.

The organosilicon compound may be one prepared by a well-known method. For example, it may be obtained from (co-hydrolytic) condensation of a silphenylene skeleton-bearing organosilicon compound having a hydrolyzable or hydroxyl group with a hydrolyzable silane or siloxane by a standard method. The silphenylene skeleton-bearing organosilicon compound having a hydrolyzable or hydroxyl group is represented by the formula (5):

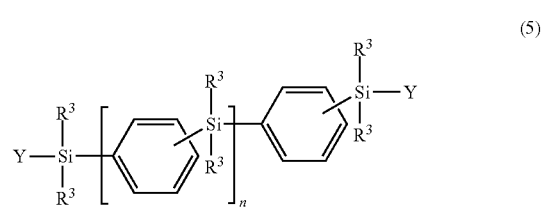
(5)

wherein $R^3$ and n are as defined above, and Y is a hydrolyzable or hydroxyl group. An organosilicon compound having formula (5) wherein Y is OX wherein X is as defined above may be used as component (A) without further modification.

In formula (5), examples of the hydrolyzable group Y include $C_1$-$C_{10}$, preferably $C_1$-$C_6$ alkoxy groups such as methoxy, ethoxy, propoxy and butoxy, $C_2$-$C_{10}$ alkoxyalkoxy groups such as methoxymethoxy and methoxyethoxy, $C_1$-$C_{10}$ acyloxy groups such as acetoxy, $C_2$-$C_{10}$ alkenyloxy groups such as isopropenoxy, and halogen atoms such as chlorine, bromine and iodine. Preferably Y is hydroxyl, chlorine, methoxy or ethoxy.

Examples of the silphenylene skeleton-bearing organosilicon compound having formula (5) are given below.

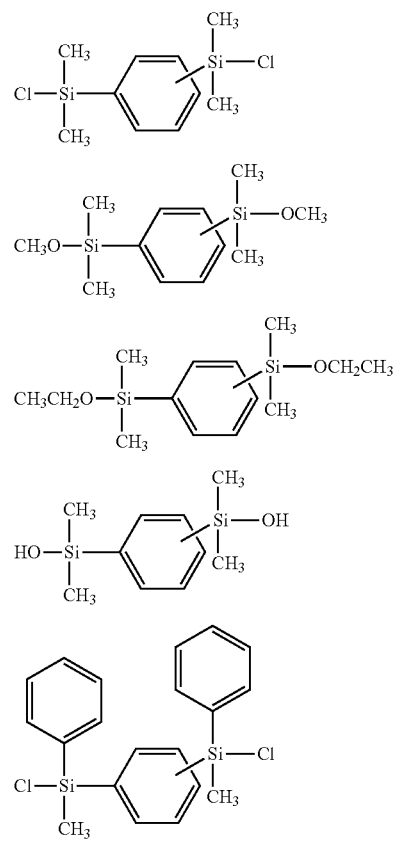

-continued
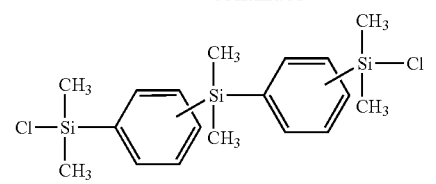
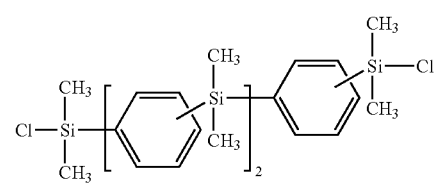
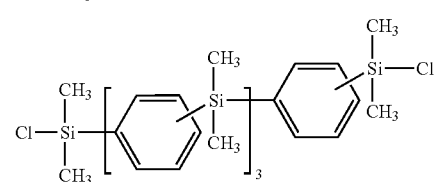
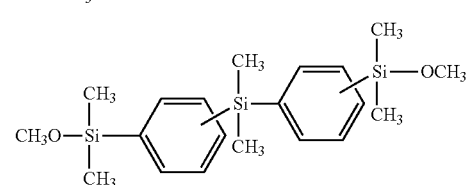
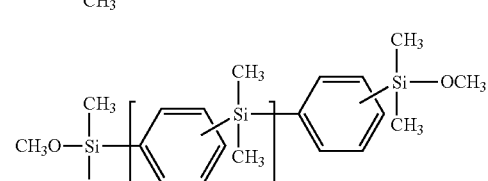
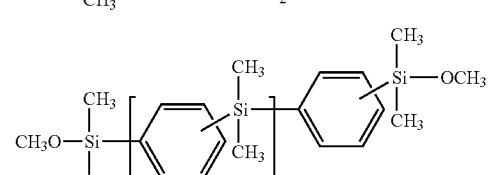
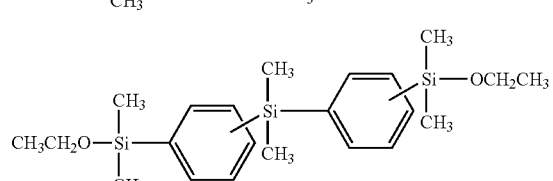
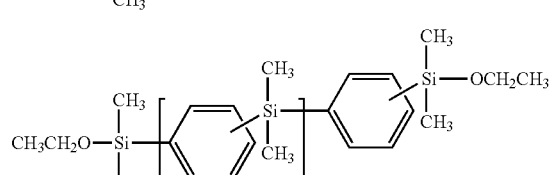
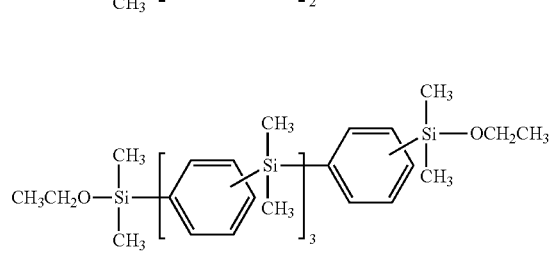
-continued
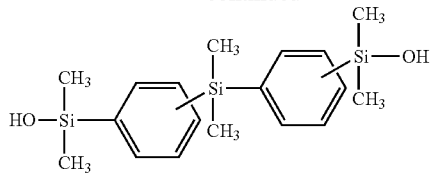
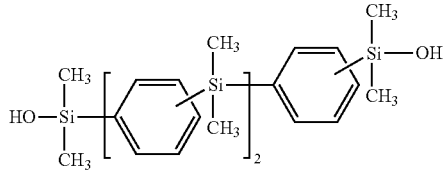
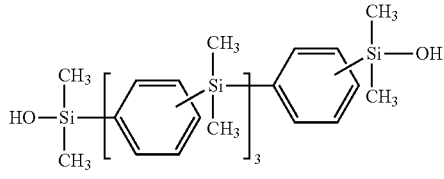
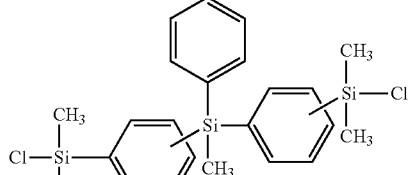
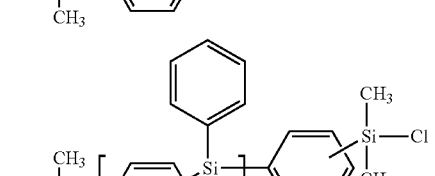
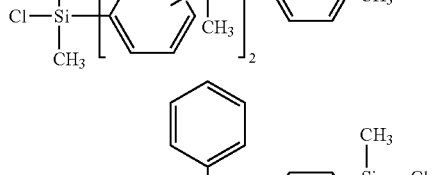
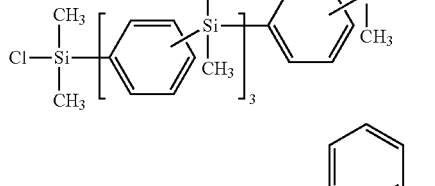
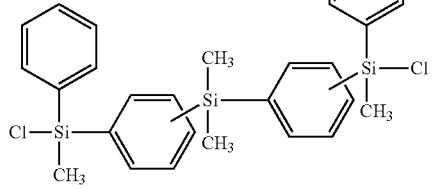
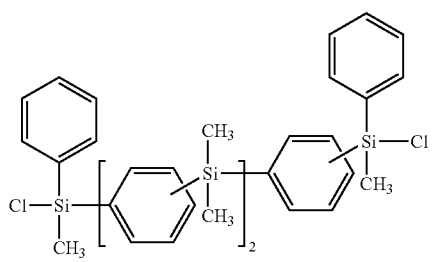

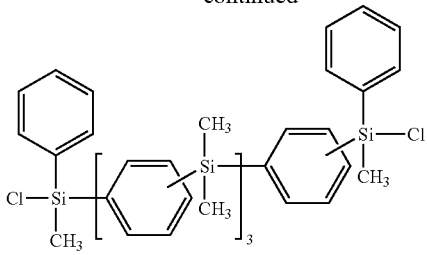

Component (A) may be used alone or in admixture of two or more.

(B) Organosilicon Compound Having Hydrogen and Hydroxyl and/or Alkoxy Group

Component (B) is an organosilicon compound having a hydrogen atom and a hydroxyl and/or alkoxy group on a common silicon atom, represented by the general formula (3).

$$(R^1{}_3SiO_{0.5})_{a'}(R^4{}_2SiO)_{b'}(R^2SiO_{1.5})_{c'}(SiO_2)_{d'}Z_{e'}(O_{0.5}X)_{f'}(R^1{}_kHSi(OX)_{2-k}O_{0.5})_{g'} \quad (3)$$

Herein $R^1$, $R^2$, $Z$ and $X$ are as defined above, $R^4$ is hydrogen, a $C_1$-$C_{12}$ unsubstituted monovalent hydrocarbon group or OX, a' is an integer of 0 to 500, b' is an integer of 0 to 5,000, c' is an integer of 0 to 500, d' is an integer of 0 to 500, e' is an integer of 0 to 500, f' is an integer of 0 to 100, g' is an integer of 2 to 100, k is 0 or 1, and a'+b'+c'+d'+e'+g' is an integer of 2 to 5,002.

In formula (3), $R^1$, $R^2$, Z and X are as defined and exemplified above in formula (1).

$R^4$ is hydrogen, a $C_1$-$C_{12}$ unsubstituted monovalent hydrocarbon group or OX. Examples of the $C_1$-$C_{12}$ unsubstituted monovalent hydrocarbon group are the same as exemplified above for $R^1$ in formula (1). X is the same as X in formula (1), with examples being the same.

In formula (3), a' is an integer of 0 to 500, preferably 0 to 250, and more preferably 0 to 100; b' is an integer of 0 to 5,000, preferably 0 to 2,500, and more preferably 0 to 1,000; c' is an integer of 0 to 500, preferably 0 to 250, and more preferably 0 to 100; d' is an integer of 0 to 500, preferably 0 to 250, and more preferably 0 to 100; e' is an integer of 0 to 500, preferably 1 to 500, more preferably 1 to 250, and even more preferably 1 to 100; f' is an integer of 0 to 100, preferably 1 to 100, more preferably 2 to 75, and even more preferably 2 to 50; g' is an integer of 2 to 100, preferably 2 to 75, and more preferably 2 to 50; k is 0 or 1, preferably 0; and a'+b'+c'+d'+e'+g' is an integer of 2 to 5,002, preferably 2 to 4,000, and more preferably 2 to 2,500.

Since the $(R^1{}_kHSi(OX)_{2-k}O_{0.5})$ unit in component (B) is readily hydrolyzable, it undergoes cohydrolysis with the OX group in component (A) even in the absence of a catalyst, whereby quick condensation curing reaction takes place.

The organosilicon compound as component (B) may be one prepared by a well-known method. As described in JP-A 2014-167091, for example, it may be obtained from condensation reaction of a silanol-containing organosilicon compound with an organosilicon compound having a hydrogen atom and at least two alkoxy groups on a common silicon atom in the presence of a catalyst. The catalyst is selected from hydroxides of Group 2 elements, hydrates of hydroxides of Group 2 elements, oxides of Group 2 elements, and hydroxides and oxides of Group 3 to 15 metal elements in the Periodic Table.

Component (B) may be used alone or in admixture.

An amount of component (B) used is 0.1 to 200 parts, preferably 0.5 to 100 parts, more preferably 1 to 50 parts by weight per 100 parts by weight of component (A). Within the range, both crack resistance due to the silphenylene skeleton in component (A) and curability due to component (B) are ensured.

Embodiment 2: Comprising Essential Component (C)

(C) Silphenylene Skeleton-Bearing Organosilicon Compound Having Hydrogen and Hydroxyl and/or Alkoxy Group Component (C) is a silphenylene skeleton-bearing organosilicon compound having a hydrogen atom and a hydroxyl and/or alkoxy group on a common silicon atom, represented by the general formula (4).

$$(R^1{}_3SiO_{0.5})_{a''}(R^4{}_2SiO)_{b''}(R^2SiO_{1.5})_{c''}(SiO_2)_{d''}Z_{e''}(O_{0.5}X)_{f''}(R^1{}_kHSi(OX)_{2-k}O_{0.5})_{g''} \quad (4)$$

Herein $R^1$, $R^2$, Z, X and k are as defined above, a" is an integer of 0 to 500, b" is an $R^4$, integer of 0 to 5,000, c" is an integer of 0 to 500, d" is an integer of 0 to 500, e" is an integer of 1 to 500, f" is an integer of 0 to 100, g" is an integer of 2 to 100, k is 0 or 1, and a"+b"+c"+d"+e"+g" is an integer of 3 to 5,003.

In formula (4), $R^1$, $R^2$, $R^4$, Z and X are as defined and exemplified above in formula (1) or (3).

In formula (4), a" is an integer of 0 to 500, preferably 0 to 250, and more preferably 0 to 100; b" is an integer of 0 to 5,000, preferably 0 to 2,500, and more preferably 0 to 1,000; c" is an integer of 0 to 500, preferably 0 to 250, and more preferably 0 to 100; d" is an integer of 0 to 500, preferably 0 to 250, and more preferably 0 to 100; e" is an integer of 1 to 500, preferably 1 to 250, and more preferably 1 to 100; f" is an integer of 0 to 100, preferably 0 to 75, and more preferably 0 to 50; g" is an integer of 2 to 100, preferably 2 to 75, and more preferably 2 to 50; k is 0 or 1, preferably 0; and a"+b"+c"+d"+e"+g" is an integer of 3 to 5,003, preferably 3 to 4,000, and more preferably 3 to 2,500.

Since the $(R^1{}_kHSi(OX)_{2-k}O_{0.5})$ unit in component (C) is readily hydrolyzable, it undergoes (co)hydrolysis even in the absence of a catalyst, whereby quick condensation curing reaction takes place.

Component (C) may be used alone or in admixture.

The organosilicon compound as component (C) may be one prepared by a well-known method. For example, like the method for preparing component (B), it may be obtained from condensation reaction of a silphenylene skeleton-bearing organosilicon compound having a silanol group with an organosilicon compound having a hydrogen atom and at least two alkoxy groups on a common silicon atom in the presence of a specific catalyst.

Also a partial reaction product of components (A) and (B) may be used as component (C). In this case, the reaction product of components (A) and (B) may be obtained by mixing sufficient amounts of components (A) and (B) to form the desired component (C) and heating the mixture at 50 to 200° C. for 0.5 to 72 hours. Any desired solvent may be used to adjust the reaction rate.

The resin composition is characterized by the absence of a condensation catalyst independent of whether it is Embodiment 1 or Embodiment 2. The condensation catalyst is used herein to encompass metal catalysts and acid and base catalysts. Exemplary metal catalysts include metal alkoxides having methoxy, ethoxy, isopropoxy and tertbutoxy groups; metal salts of aliphatic carboxylic acids such as acetic acid, acetoacetic acid, 2-ethylhexanoic acid, octylic acid, neodecanoic acid, lauric acid and stearic acid; metal salts of alicyclic carboxylic acids such as naphthenic acid; metal salts of aromatic carboxylic acids such as benzoic acid, p-tert-butylbenzoic acid, and salicylic acid; and metal chelates with acetylacetonate and 2,2,6,6-tetramethyl-3,5-heptanedionate. Exemplary acid and base catalysts include acidic catalysts such as carboxylic acid, phenylboronic acid, and trispentafluorophenylborane, and basic catalysts such as ammonia, amine, alkali metal silanolates and siliconates, ammonium and phosphonium hydroxides and silanolates thereof, ammonium and phosphonium alkoxides. If the resin composition contains such a catalyst, heat resistance and light resistance are adversely affected, and the cured composition may be colored with the catalyst.

To the condensation curable resin composition, (D) a hydrolyzable organosilicon compound is optionally added for the purpose of promoting cure.

(D) Hydrolyzable Organosilicon Compound

Component (D) is an organosilicon compound having at least two hydrolyzable groups selected from acetoxy, ketoxime and alkenoxy groups per molecule or a partial hydrolyzate thereof. The organosilicon compound should have at least two hydrolyzable groups, preferably at least three hydrolyzable groups per molecule.

The organosilicon compound may have a silicon-bonded organic group other than the hydrolyzable groups. The additional organic group is preferably selected from $C_1$-$C_{12}$ unsubstituted monovalent hydrocarbon groups, as exemplified above for $R^2$. Inter alia, $C_1$-$C_6$ alkyl groups and $C_6$-$C_{12}$ aryl groups are preferred for ease of synthesis.

Examples of the organosilicon compound as component (D) include acetoxysilanes such as diacetoxymethylsilane, diacetoxydimethylsilane, methyltriacetoxysilane, tetraacetoxysilane, ethyltriacetoxysilane, and diacetoxymethylphenylsilane, silanes having a ketoxime group such as methyltri(butanoxime)silane, phenyltri(butanoxime)silane and propyltri(butanoxime)silane, silanes having an alkenoxy group such as methyltriisopropenoxysilane, triisopropenoxysilane, tetrapropenoxysilane, phenyltrialkenoxysilanes, isopropylpropenoxysilane, and butyltripropenoxysilane, and partial hydrolyzates thereof.

When used, component (D) is preferably added in an amount of 0.1 to 30 parts by weight, more preferably 0.5 to 20 parts by weight per 100 parts by weight of components (A) and (B) combined or 100 parts by weight of component (C). Less than 0.1 part of component (D) may be insufficient to promote curing of the composition whereas more than 30 parts may adversely affect shelf stability.

To the condensation curable resin composition, (E) an organosilicon compound having at least two hydroxyl and/or alkoxy groups per molecule is optionally added for the purpose of adjusting the viscosity and reaction rate of the composition and the hardness of the cured composition.

(E) Organosilicon Compound Having at Least Two Hydroxyl and/or Alkoxy Groups

Component (E) is an organosilicon compound having at least two hydroxyl and/or alkoxy groups per molecule, represented by the general formula (6). Notably, component (E) is distinguished from components (A) to (C) in that it does not contain a silphenylene skeleton and does not have hydrogen and hydroxyl and/or alkoxy group on a common silicon atom.

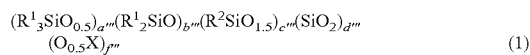

$(R^1{}_3SiO_{0.5})_{a'''}(R^1{}_2SiO)_{b'''}(R^2SiO_{1.5})_{c'''}(SiO_2)_{d'''}$
$(O_{0.5}X)_{f''}$ (1)

Herein $R^1$, $R^2$ and X are as defined above, a''' is an integer of 0 to 500, b''' is an integer of 0 to 5,000, c''' is an integer of 0 to 500, d''' is an integer of 0 to 500, f'' is an integer of 2 to 100, and 1≤b'''+c'''+d'''≤5,000.

In formula (6), $R^1$, $R^2$ and X are as defined and exemplified above in formula (1).

In formula (6), a''' is an integer of 0 to 500, preferably 0 to 250, and more preferably 0 to 100; b''' is an integer of 0 to 5,000, preferably 0 to 2,500, and more preferably 0 to 1,000; c''' is an integer of 0 to 500, preferably 0 to 250, and more preferably 0 to 100; d''' is an integer of 0 to 500, preferably 0 to 250, and more preferably 0 to 100; f'' is an integer of 2 to 100, preferably 2 to 75, and more preferably 2 to 50; 1≤b'''+c'''+d'''≤5,000, preferably 5≤b'''+c'''+d'''≤2,500, and more preferably 10≤b'''+c'''+d'''≤1,000.

When used, component (E) is preferably added in an amount of 5 to 500 parts by weight, more preferably 10 to 300 parts by weight per 100 parts by weight of components (A) and (B) combined or 100 parts by weight of component (C). Outside the range, a less amount may be insufficient for component (E) to exert its effect whereas an excessive amount may retard the curing rate.

In addition to the above components (A) to (E), the condensation curable resin composition may include optional additives such as phosphor, inorganic filler, adhesive aid, and cure inhibitor. These additives are described below.

Phosphor

The phosphor used herein is not particularly limited and any well-known phosphors may be used. One preferred example is the phosphor capable of absorbing light from a semiconductor chip, typically a semiconductor LED including a light-emissive layer of nitride semiconductor and converting it to light of different wavelength. Suitable such phosphors include nitride base phosphors and oxynitride base phosphors which are activated mainly with a lanthanoid element such as Eu or Ce; alkaline earth metal halide apatite phosphors which are activated mainly with a lanthanoid element such as Eu or a transition metal element such as Mn, alkaline earth metal borate halide phosphors, alkaline earth metal aluminate phosphors, alkaline earth metal silicate phosphors, alkaline earth metal sulfide phosphors, alkaline earth metal thiogallate phosphors, alkaline earth metal silicon nitride phosphors, and germanate phosphors; rare earth aluminate phosphors which are activated mainly with a lanthanoid element such as Ce; rare earth silicate phosphors; organic and organic complex phosphors which are activated mainly with a lanthanoid element such as Eu; and Ca—Al—Si—O—N oxynitride glass phosphors, which may be used alone or in admixture.

Exemplary of the nitride phosphors which are activated mainly with a lanthanoid element such as Eu or Ce are $M_2Si_5N_8$:Eu wherein M is at least one element selected from Sr, Ca, Ba, Mg, and Zn. Also included are $MSi_7N_{10}$:Eu, $M_{1.8}Si_5O_{0.2}N_8$:Eu, and $M_{0.9}Si_7O_{0.1}N_{10}$:Eu wherein M is at least one element selected from Sr, Ca, Ba, Mg, and Zn.

Exemplary of the oxynitride phosphors which are activated mainly with a lanthanoid element such as Eu or Ce are $MSi_2O_2N_2$:Eu wherein M is at least one element selected from Sr, Ca, Ba, Mg, and Zn.

Exemplary of the alkaline earth metal halide apatite phosphors which are activated mainly with a lanthanoid element such as Eu or a transition metal element such as Mn are $M_5(PO_4)_3X'$:R' wherein M is at least one element selected from Sr, Ca, Ba, Mg, and Zn, X' is at least one element selected from F, Cl, Br and I, and R' is Eu, Mn, or Eu and Mn.

Exemplary of the alkaline earth metal borate halide phosphors are $M_2B_5O_9X'$:R' wherein M is at least one element selected from Sr, Ca, Ba, Mg, and Zn, X' is at least one element selected from F, Cl, Br and I, and R' is Eu, Mn, or Eu and Mn.

Exemplary of the alkaline earth metal aluminate phosphors are $SrAl_2O_4$:R', $Sr_4Al_{14}O_{25}$:R', $CaAl_2O_4$:R', $BaMg_2Al_{16}O_{27}$:R', $BaMg_2Al_{16}O_{12}$:R' and $BaMgAl_{10}O_{17}$:R' wherein R' is Eu, Mn, or Eu and Mn.

Exemplary of the alkaline earth metal sulfide phosphors are $La_2O_2S$:Eu, $Y_2O_2S$:Eu and $Gd_2O_2S$:Eu.

Exemplary of the rare earth aluminate phosphors which are activated mainly with a lanthanoid element such as Ce are YAG base phosphors of the compositional formulae: $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, and $(Y,Gd)_3(Al,Ga)_5O_{12}$:Ce. Also included are variants of the foregoing wherein Y is partly or entirely replaced by Tb or Lu, such as $Tb_3Al_5O_{12}$:Ce and $Lu_3Al_5O_{12}$:Ce.

Other suitable phosphors include ZnS:Eu, $Zn_2GeO_4$:Mn, and $MGa_2S_4$:Eu wherein M is at least one element selected from Sr, Ca, Ba, Mg, and Zn.

In the above phosphors, at least one element selected from Tb, Cu, Ag, Au, Cr, Nd, Dy, Co, Ni and Ti may be incorporated instead of Eu or in addition to Eu, if desired.

The Ca—Al—Si—O—N oxynitride glass phosphors are phosphors based on an oxynitride glass matrix consisting of 20 to 50 mol % of $CaCO_3$ (calculated as CaO), 0 to 30 mol % of $Al_2O_3$, 25 to 60 mol % of $SiO$, 5 to 50 mol % of MN, and 0.1 to 20 mol % of a rare earth oxide or transition metal oxide, the total of five ingredients being 100 mol %. In the phosphors based on an oxynitride glass matrix, the nitrogen content is preferably up to 15 mol %, and besides the rare earth oxide ion, another rare earth ion serving as a sensitizer is preferably contained in the phosphor glass in a content of 0.1 to 10 mol % of rare earth oxide as a co-activator.

Phosphors other than the foregoing may also be used as long as they have equivalent functions and effects.

The phosphor takes the form of particles having an average particle size of preferably at least 10 nm, more preferably 10 nm to 10 µm, and even more preferably 10 nm to 1 µm. Notably, the average particle size is measured by a particle size distribution measurement system CILAS using the laser light diffraction method.

When added, the amount of the phosphor is preferably 0.1 to 2,000 parts, more preferably 1 to 1,000 parts by weight per 100 parts by weight of the other components, typically components (A) and (B) combined or component (C).

Inorganic Filler

Suitable inorganic fillers include silica, fumed silica, fumed titanium dioxide, alumina, calcium carbonate, calcium silicate, titanium dioxide, ferric oxide, and zinc oxide, which may be used alone or in admixture. When added, the amount of the filler is preferably up to 20 parts, more preferably 0.1 to 10 parts by weight per 100 parts by weight of components (A) and (B) combined or component (C), but not limited thereto.

Adhesive Aid

An adhesive aid may be added to the resin composition for imparting adhesion thereto, if desired. Suitable adhesive aids are organosiloxane oligomers having per molecule at least two functional groups selected from silicon-bonded hydrogen, alkenyl and alkoxy, and an epoxy group. The organosiloxane oligomers preferably have 4 to 50 silicon atoms, more preferably 4 to 20 silicon atoms. These oligomers differ from the foregoing components in that the oligomer does not contain a silphenylene skeleton, does not have hydrogen and hydroxyl and/or alkoxy group on a common silicon atom, but essentially contains an epoxy group.

Also useful as the adhesive aid are organooxysilyl-modified isocyanurate compounds having the formula (7) below and hydrolytic condensates thereof (i.e., organosiloxane-modified isocyanurate compounds).

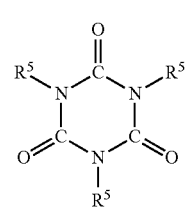

(7)

In formula (7), $R^5$ is each independently an organic group having the formula (8) below, or a monovalent unsaturated aliphatic hydrocarbon group which may contain an oxygen atom, with the proviso that at least one $R^5$ is an organic group of formula (8).

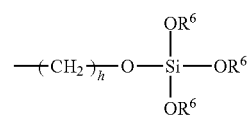

(8)

Herein $R^6$ is hydrogen or a $C_1$-$C_6$ unsubstituted monovalent hydrocarbon group, examples of which are as exemplified above for X in formula (1), and h is an integer of 1 to 6, preferably 1 to 4.

In formula (7), the monovalent unsaturated aliphatic hydrocarbon group represented by $R^5$ may optionally contain oxygen, and is preferably selected from hydrocarbon groups of 2 to 8 carbon atoms, more preferably 2 to 6 carbon atoms, for example, linear or branched alkenyl groups such as vinyl, allyl, 1-butenyl, 1-hexenyl and 2-methylpropenyl, and (meth)acrylic groups.

When added, the amount of the adhesive aid is preferably up to 10 parts, more preferably 0.1 to 8 parts, and even more preferably 0.2 to 5 parts by weight per 100 parts by weight of components (A) and (B) combined or component (C). As long as the amount is within the range, adhesion is improved at no sacrifice of the benefits of the invention.

Other Additives

Besides the above components, other additives may be added to the resin composition. Suitable additives include a radical scavenger, flame retardant, surfactant, photostabilizer, thickener, plasticizer, antioxidant, heat stabilizer, conductive agent, antistatic agent, radiation shielding agent, nucleating agent, phosphorus peroxide decomposing agent, lubricant, pigment, metal inactivating agent, physical property regulator, and organic solvent. These optional additives may be used alone or in admixture.

The simplest embodiment of the condensation curable resin composition is a composition consisting of components (A) and (B), or component (C). Particularly when it is desired that a cured product have high transparency, the composition should preferably be free of an inorganic filler such as silica filler. Examples of the inorganic filler are as described above.

The method for preparing the condensation curable resin composition is not particularly limited. The composition may be prepared by any prior art well-known methods, for example, by mixing components (A) and (B) or component (C), and optional components in a standard way. For example, the components are fed into a commercially available mixer (e.g., Thinky Conditioning Mixer by Thinky Corp.) where they are mixed for about 1 to 5 minutes until uniform.

The method for curing the condensation curable resin composition is not particularly limited. The composition may be cured by any prior art well-known methods, for example, by heating at 30 to 200° C. for about 1 to 48 hours. Preferably the composition is cured stepwise over a temperature range from 60° C. to 200° C. The preferred stepwise curing includes two steps, for example. The resin composition is heated at a temperature of 60 to 100° C. for 0.5 to 4 hours for achieving full deaeration before it is heated at a temperature of 120 to 200° C. for 1 to 48 hours for heat curing. Such stepwise curing ensures that even when the composition to be cured is thick walled, it is fully cured into a colorless transparent product without bubbles. The term "colorless transparent product" means that a cured part of 1 mm thick has a light transmittance of at least 80%, preferably at least 85%, and most preferably at least 90% at wavelength 450 nm.

Since the condensation curable resin composition cures into a product having a high light transmittance, it is suited for the encapsulation of LED chips, especially blue and purple LED chips. An LED chip or microelectronic device may be encapsulated with the condensation curable resin composition by any prior art well-known methods, for example, dispensing or compression molding.

Since the condensation curable resin composition cures into a product having crack resistance, heat resistance, light resistance and transparency, it is also suited in a variety of applications including display materials, optical recording media materials, optical equipment materials, optical part materials, optical fiber materials, optoelectronic functional organic materials, and semiconductor IC-related materials.

EXAMPLE

Examples of the invention are given below by way of illustration and not by way of limitation. In Examples, all parts are by weight (pbw) unless otherwise indicated.

Components (A) to (F) used in Examples have the following structures. Me stands for methyl, Et for ethyl, iPr for isopropyl, Ph for phenyl, and Z, Z' and Z" have the following formulae.

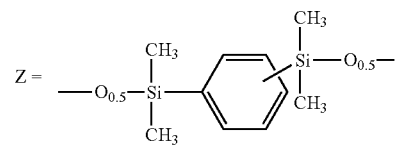

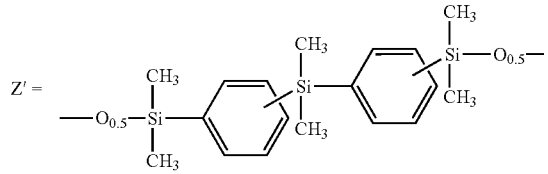

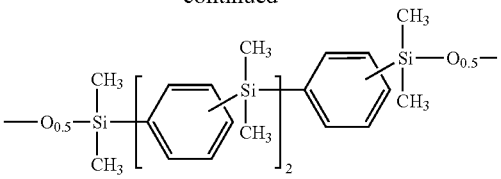

(A-1) Branched silphenylene skeleton-bearing organosilicon compound of the formula below (Shin-Etsu Chemical Co., Ltd.)

$(Me_3SiO_{0.5})_4(PhSiO_{1.5})_{16}Z'_3(O_{0.5}H)_4$ (A-2) Branched silphenylene skeleton-bearing organosilicon compound of the formula below (Shin-Etsu Chemical Co., Ltd.)

$(Me_3SiO_{0.5})_4(PhSiO_{1.5})_{16}Z_3(O_{0.5}H)_4$ (A-3) Branched silphenylene skeleton-bearing organosilicon compound of the formula below (Shin-Etsu Chemical Co., Ltd.)

$(Me_3SiO_{0.5})_{30}(SiO_2)_{45}Z'_5(O_{0.5}R)_6$ R=H or iPr (A-4) Branched silphenylene skeleton-bearing organosilicon compound of the formula below (Shin-Etsu Chemical Co., Ltd.)

$(Me_3SiO_{0.5})_{180}(SiO_2)_{180}Z'_{40}(O_{0.5}R)_{60}$ R=H or Et (A-5) Branched silphenylene skeleton-bearing organosilicon compound of the formula below (Shin-Etsu Chemical Co., Ltd.)

$(Me_3SiO_{0.5})_{30}(Me_2SiO)_{30}(MeSiO_{1.5})_{190}Z'_{20}(O_{0.5}R)_{50}$ R=H or Me (A-6) Linear silphenylene skeleton-bearing organosilicon compound of the formula below (Shin-Etsu Chemical Co., Ltd.)

$MeO_{0.5}$—$Z''$—$O_{0.5}Me$ (A-7) Linear silphenylene skeleton-bearing organosilicon compound of the formula below (Shin-Etsu Chemical Co., Ltd.)

$HO_{0.5}$-$(PhMeSiO)_{28}Z_2$—$O_{0.5}H$ (A-8) Linear silphenylene skeleton-bearing organosilicon compound of the formula below (Shin-Etsu Chemical Co., Ltd.)

$HO_{0.5}$-$(PhMeSiO)_{28}Z_2$—$O_{0.5}H$ (A-9) Linear silphenylene skeleton-bearing organosilicon compound of the formula below (Shin-Etsu Chemical Co., Ltd.)

$RO_{0.5}$-$(Me_2SiO)_{300}Z'_{45}$—$O_{0.5}R$ R=H or Me (A-10) Linear silphenylene skeleton-bearing organosilicon compound of the formula below (Shin-Etsu Chemical Co., Ltd.)

$RO_{0.5}$-$(Me_2SiO)_{1980}Z'_{495}$—$O_{0.5}R$ R=H or Me (B-1) Organosilicon compound having hydrogen and alkoxy on a common silicon atom, of the formula below (Shin-Etsu Chemical Co., Ltd.)

$(HSi(OEt)_2O_{0.5})_2(Ph_2SiO)$ (B-2) Organosilicon compound having hydrogen and alkoxy on a common silicon atom, of the formula below (Shin-Etsu Chemical Co., Ltd.)

$(HSi(OMe)_2O_{0.5})_2(Me(OMe)SiO)_3$ (B-3) Organosilicon compound having hydrogen and alkoxy on a common silicon atom, of the formula below (Shin-Etsu Chemical Co., Ltd.)

$(HSi(OMe)_2O_{0.5})_2(Me_2SiO)_{1980}$ (B-4) Organosilicon compound having hydrogen and alkoxy on a common silicon atom, of the formula below (Shin-Etsu Chemical Co., Ltd.)

$(HSi(OMe)_2O_{0.5})_4(Me_3SiO_{0.5})_4(PhSiO_{1.5})_{16}$ (B-5) Organosilicon compound having hydrogen and alkoxy on a common silicon atom, of the formula below (Shin-Etsu Chemical Co., Ltd.)

$(HSi(OMe)_2O_{0.5})_{62}(Me_3SiO_{0.5})_{196}(SiO_2)_{191}(O_{0.5}Et)_{10}$ (B-6) Organosilicon compound having hydrogen and alkoxy on a common silicon atom, of the formula below (Shin-Etsu Chemical Co., Ltd.)

$(HSi(OMe)_2O_{0.5})_{38}(Me_3SiO_{0.5})_{30}(Me_2SiO)_{30}(MeSiO_{1.5})_{200}(O_{0.5}Me)_{22}$ (C-1) Silphenylene skeleton-bearing organosilicon compound having hydrogen and alkoxy on a common silicon atom, of the formula below (Shin-Etsu Chemical Co., Ltd.)

$(HSi(OMe)_2O_{0.5})_{48}(Me_3SiO_{0.5})_{180}(SiO_2)_{180}Z'_{40}(O_{0.5}Et)_{12}$ (C-2) Silphenylene skeleton-bearing organosilicon compound having hydrogen and alkoxy on a common silicon atom, of the formula below (Shin-Etsu Chemical Co., Ltd.)

$(HSi(OMe)_2O_{0.5})_{26}(Me_3SiO_{0.5})_{31})(Me_2SiO)_{30}(MeSiO_{1.5})_{190}Z'_{20}(O_{0.5}Me)_{24}$ (C-3) Condensate of (A-1) and (B-1) synthesized as follows. In a 10-L flask, 3,414 g (1 mol) of (A-1) and 1,274 g (3.5 mol) of (B-1) were uniformly dissolved in 1,500 g of toluene and heated at 100° C. for 6 hours for condensation reaction. Toluene was distilled off in vacuum, yielding the following compound.

$(HSi(OEt)_2O_{0.5})_6(HSi(OEt)O)_8(Ph_2SiO)_7(Me_3SiO_{0.5})_8(PhSiO_{1.5})_{32}Z'_6$ (D-1) Phenyltriisopropenoxysilane of the formula below (Shin-Etsu Chemical Co., Ltd.)

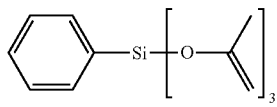

(D-2) Methyltrisbutanoximesilane of the formula below (Shin-Etsu Chemical Co., Ltd.)

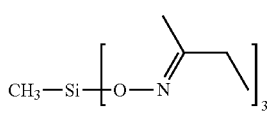

(E-1) Branched organosilicon compound of the formula below (Shin-Etsu Chemical Co., Ltd.)

$(Me_3SiO_{0.5})_4(PhSiO_{1.5})_{18}(O_{0.5}H)_4$ (E-2) Branched organosilicon compound of the formula below (Shin-Etsu Chemical Co., Ltd.)

$(Me_3SiO_{0.5})_{30}(SiO_2)_{45}(O_{0.5}H)_4$ R=H or iPr (E-3) Linear organosilicon compound of the formula below (Shin-Etsu Chemical Co., Ltd.)

$HO\text{-}(PhMeSiO)_{30}\text{-}H$ (E-4) Linear organosilicon compound of the formula below (Shin-Etsu Chemical Co., Ltd.)

$RO\text{-}(Me_2SiO)_{300}\text{-}R$ R=H or Me (E-5) Linear organosilicon compound of the formula below (Shin-Etsu Chemical Co., Ltd.)

$RO\text{-}(Me_2SiO)_{25000}\text{-}R$ R=H or Me (F) Condensation catalyst:
Orgatix® TC-750
(ethylacetoacetate titanate, Matsumoto Fine Chemical Co., Ltd., Ti content 11.2 wt %)

Examples 1 to 13 and Comparative Examples 1 to 3

Condensation curable resin compositions were prepared by mixing the components in the amounts shown in Tables 1 and 2. These resin compositions were examined by the following tests.

(1) Viscosity of Resin Composition

A viscosity at 23° C. of the curable resin composition was measured according to JIS Z 8803:2011 by a Brookfield viscometer.

(2) Hardness of Cured Product

The resin composition was cast into an aluminum dish of 50 mm diameter and 10 mm thick, and cured stepwise at 60° C. for 1 hour, at 100° C. for 1 hour, and at 150° C. for 4 hours into a cured product. The cured product was measured for Shore D or Durometer Type A hardness according to JIS K 6253-3:2012.

(3) Tensile Strength and Elongation at Break of Cured Product

The resin composition was cast into a concave Teflon® mold of 150 mm×200 mm×2 mm thick and cured stepwise at 60° C. for 1 hour, at 100° C. for 1 hour, and at 150° C. for 8 hours. The cured sample was measured for tensile strength and elongation at break on a tensile tester EZ TEST (EZ-L by Shimadzu Corp.) according to JIS K 6251:2010 under conditions including a separation rate of 500 mm/min, a distance between grips of 80 mm, and a distance between two gage marks of 40 mm.

(4) Thermal Cycling Test

The resin composition was dispensed on a package (Tiger 3528, Shin-Etsu Chemical Co., Ltd.) and cured stepwise at 60° C. for 1 hour, at 100° C. for 1 hour, and at 150° C. for 8 hours, obtaining a test sample in the form of the package encapsulated with the cured product. On twenty test samples, a thermal cycling test (TCT) between −55° C. and 165° C. was carried out over 1,000 cycles. The number of test samples in which the encapsulant cracked was counted.

(5) Light Transmittance of Cured Product

A concave Teflon® spacer of 1 mm thick was sandwiched between two slide glass plates of 50 mm×20 mm×1 mm thick and fixedly secured. The resin composition was cast into the space, and cured stepwise at 60° C. for 1 hour, at 100° C. for 1 hour, and at 150° C. for 8 hours. The cured sample was measured for light transmittance at wavelength 450 nm on a spectrometer U-4100 (Hitachi High-Technologies Corp.).

(6) Heat Resistance Test

The sample in test (5) was allowed to stand at 180° C. for 1,000 hours before it was measured for light transmittance at 450 nm on spectrometer U-4100.

(7) Light Resistance Test

The sample in test (5) was exposed at 100° C. to laser light of 440 nm (power 250 mW/mm$^2$) for 1,000 hours using a thermostat laser irradiation system (light source UV-LED by Nichia Corp., oven ESPEC STH-120, detector ADVANTEST R8240). The transmittance at 440 nm of the sample after 1,000 hours of laser exposure is expressed relative to the transmittance at 440 nm of the sample at the initial (0 hr) which is 100%.

The test results are shown in Tables 3 and 4.

TABLE 1

| Amount (pbw) | Example | | | | | | | |
|---|---|---|---|---|---|---|---|---|
| | 1 | 2 | 3 | 4 | 5 | 6 | 7 | 8 |
| (A-1) | 100 | 100 | 100 | | | | | |
| (A-2) | | | | 100 | | | | |
| (A-3) | | | | | 100 | | | |
| (A-4) | | | | | | 100 | | |
| (A-5) | | | | | | | 100 | |
| (A-6) | | | | | | | | 40 |
| (A-7) | | | | | 100 | | | |
| (A-8) | 100 | 100 | | 100 | | | | |
| (A-9) | | | | | | 390 | 200 | 250 |
| (A-10) | | | | | 5 | | | |
| (B-1) | 10 | 10 | 10 | | 5 | | | |
| (B-2) | | | | | | 20 | | 1.5 |
| (B-3) | | | | | | | 5 | |
| (B-4) | | | | 200 | | | | |
| (B-5) | | | | | | 100 | | |
| (B-6) | | | | | | | | |
| (C-1) | | | | | | | | |
| (C-2) | | | | | | | | |
| (C-3) | | | | | | | | |
| (D-1) | | | 20 | | | | | |
| (D-2) | | | | | | | | |

TABLE 1-continued

| Amount (pbw) | Example | | | | | | | |
|---|---|---|---|---|---|---|---|---|
| | 1 | 2 | 3 | 4 | 5 | 6 | 7 | 8 |
| (E-1) | | | | | | | | |
| (E-2) | | | | | | | | |
| (E-3) | | | 100 | | | | | |
| (E-4) | | | | | | | | |
| (E-5) | | | | | | | | |
| (F) | | | | | | | | |

TABLE 2

| Amount (pbw) | Example | | | | | Comparative Example | | |
|---|---|---|---|---|---|---|---|---|
| | 9 | 10 | 11 | 12 | 13 | 1 | 2 | 3 |
| (A-1) | | | | | | | | |
| (A-2) | | | | | | | | |
| (A-3) | | | | | | | | |
| (A-4) | | | | | | | | |
| (A-5) | 100 | | | | | | | |
| (A-6) | | | | | | | | |
| (A-7) | | | | | | | | |
| (A-8) | | | | | | | | |
| (A-9) | 250 | 200 | | | | | | |
| (A-10) | | | | | | | 10 | |
| (B-1) | | | | | | | | |
| (B-2) | 1.5 | 20 | | | | | | |
| (B-3) | | | | | | | | |
| (B-4) | | | | | | | | |
| (B-5) | | | | | | | | |
| (B-6) | | | 100 | | | | | |
| (C-1) | | | 100 | | | | | |
| (C-2) | | | | 100 | | | | |
| (C-3) | | | | | 100 | | | |
| (D-1) | | | | | | | | |
| (D-2) | 5 | | | | | | | |
| (E-1) | | | | | | 100 | 100 | |
| (E-2) | | | | | | | | 100 |
| (E-3) | | | | 100 | 100 | 100 | | |
| (E-4) | 250 | 250 | | | | | | 390 |
| (E-5) | | | | | | | | 5 |
| (F) | | | | | | 0.1 | | 0.1 |

TABLE 3

| Test results | | | | | Example | | | | | | | |
|---|---|---|---|---|---|---|---|---|---|---|---|---|
| | | | | | 1 | 2 | 3 | 4 | 5 | 6 | 7 | 8 |
| Viscosity, 23° C. (Pa·s) | | | | | 4.8 | 2.8 | 4.4 | 9.6 | 4.8 | 3.3 | 14.6 | 5.3 |
| Hardness | | Shore D | | | 32 | 34 | 30 | 54 | 27 | — | — | — |
| | | Type A | | | — | — | — | — | — | 38 | 90 | 72 |
| Tensile strength, 25° C. (MPa) | | | | | 3.8 | 4 | 3.4 | 7.5 | 3.1 | 3 | 10.4 | 6.9 |
| Elongation at break, 25° C. (%) | | | | | 130 | 120 | 150 | 80 | 160 | 190 | 80 | 160 |
| TCT, −55° C.↔165° C. 1,000 cycles (number of cracked samples) | | | | | 0/20 | 0/20 | 0/20 | 0/20 | 0/20 | 0/20 | 0/20 | 0/20 |
| Light transmittance (T) | Heat resistance test | T after 180° C./ 1,000 hr heating | 1 mm thick, 450 nm | | 99.8 99.7 | 99.7 99.7 | 99.7 99.7 | 99.6 99.6 | 99.8 99.7 | 99.6 99.6 | 99.7 99.6 | 99.8 99.8 |
| | Light resistance test | Relative T after 100° C./ 1,000 hr exposure (initial T = 100%) | 1 mm thick, 440 nm | | 99.5 | 99.4 | 99.5 | 99.4 | 99.4 | 99.5 | 99.6 | 99.7 |

TABLE 4

|  | Test results |  |  | Example |  |  |  |  | Comparative Example |  |  |
|---|---|---|---|---|---|---|---|---|---|---|---|
|  |  |  |  | 9 | 10 | 11 | 12 | 13 | 1 | 2 | 3 |
|  | Viscosity, 23° C. (Pa · s) |  |  | 5 | 4.8 | 11.2 | 2.0 | 8.1 | 3.6 | 2.8 | 2.9 |
| Hardness |  | Shore D |  | — | — | — | — | 31 | 21 | 22 | — |
|  |  | Type A |  | 75 | 84 | 72 | 66 | — | — | — | 22 |
|  | Tensile strength, 25° C. (MPa) |  |  | 7.4 | 8.7 | 6.8 | 5.6 | 3.1 | 1.8 | 1.9 | 1.4 |
|  | Elongation at break, 25° C. (%) |  |  | 130 | 100 | 130 | 140 | 120 | 90 | 80 | 150 |
|  | TCT, −55° C.↔165° C. 1,000 cycles (number of cracked samples) |  |  | 0/20 | 0/20 | 0/20 | 0/20 | 0/20 | 20/20 | 18/20 | 20/20 |
| Light transmittance (T) | Heat resistance test | T after 180° C./ 1,000 hr heating | 1 mm thick, 450 nm | 99.7 99.7 | 99.7 99.6 | 99.6 99.6 | 99.7 99.7 | 99.8 99.7 | 99.7 93.3 | 99.6 99.3 | 99.8 96.4 |
|  | Light resistance test | Relative T after 100° C./ 1,000 hr exposure (initial T = 100%) | 1 mm thick, 440 nm | 99.6 | 99.6 | 99.5 | 99.7 | 99.4 | 89.3 | 99.5 | 92.1 |

It is evident from Tables 1 to 4 that the condensation curable resin compositions containing silphenylene skeleton-bearing organosilicon compounds (Examples 1 to 13) cure into products which are hard, but have acceptable elongation and satisfactory mechanical strength, in contrast to the condensation curable resin compositions consisting of silphenylene skeleton-free organosilicon compounds (Comparative Examples 1 to 3). The catalyst-free resin compositions (Examples 1 to 13 and Comparative Example 2) show higher heat resistance and light resistance than the catalyst-containing resin compositions (Comparative Examples 1 and 3). It has been demonstrated that the condensation curable resin composition containing a silphenylene skeleton-bearing organosilicon compound, but not a condensation catalyst endows the cured product with rigidity and toughness. In addition, the cured product exhibits very high heat resistance and light resistance because it is devoid of catalysts.

The condensation curable resin composition containing a silphenylene skeleton-bearing organosilicon compound according to the invention cures into a product having satisfactory mechanical properties, heat resistance and light resistance. By encapsulating a semiconductor chip with the cured resin composition, a fully reliable semiconductor package is obtained. The inventive condensation curable resin composition, despite the absence of catalyst, gives a cured product which is as satisfactory as catalyst-containing compositions. By virtue of the absence of catalyst, the cured product exhibits high heat resistance and light resistance. Because of these advantages, the resin composition is best suited for the encapsulation of LED chips, especially blue and purple LED chips.

Japanese Patent Application No. 2016-087163 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:
1. A condensation curable resin composition comprising:
    (A) 100 parts by weight of a silphenylene skeleton-bearing organosilicon compound containing at least two hydroxyl and/or alkoxy groups per molecule, represented by the general formula (1):

$$(R^1{}_3SiO_{0.5})_a(R^1{}_2SiO)_b(R^2SiO_{1.5})_c(SiO_2)_dZ_e(O_{0.5}X)_f \quad (1)$$

wherein $R^1$ is independently hydrogen or a $C_1$-$C_{12}$ unsubstituted monovalent hydrocarbon group, $R^2$ is independently a $C_1$-$C_{12}$ unsubstituted monovalent hydrocarbon group, Z is independently a group having the formula (2):

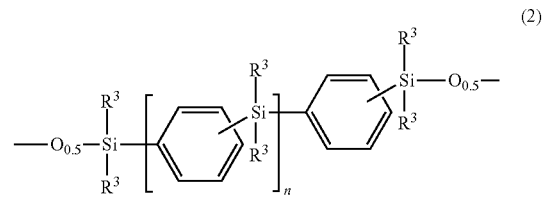

(2)

wherein $R^3$ is independently a $C_1$-$C_{12}$ unsubstituted monovalent hydrocarbon group, and n is an integer of 0 to 3, X is independently hydrogen or a $C_1$-$C_6$ unsubstituted monovalent hydrocarbon group, a is an integer of 0 to 500, b is an integer of 0 to 5,000, c is an integer of 0 to 500, d is an integer of 0 to 500, e is an integer of 1 to 500, f is an integer of 2 to 100, and a+b+c+d+e is an integer of 1 to 5,001, and
    (B) 0.1 to 200 parts by weight of an organosilicon compound having a hydrogen atom and a hydroxyl and/or alkoxy group on a common silicon atom, represented by the general formula (3):

$$(R^1{}_3SiO_{0.5})_{a'}(R^4{}_2SiO)_{b'}(R^2SiO_{1.5})_{c'}(SiO_2)_{d'}Z_{e'}(O_{0.5}X)_{f'}(R^1{}_kHSi(OX)_{2-k}O_{0.5})_{g'} \quad (3)$$

wherein $R^1$, $R^2$, Z and X are as defined above, $R^4$ is hydrogen, a $C_1$-$C_{12}$ unsubstituted monovalent hydrocarbon group or OX, a' is an integer of 0 to 500, b' is an integer of 0 to 5,000, c' is an integer of 0 to 500, d' is an integer of 0 to 500, e' is an integer of 0 to 500, f' is an integer of 0 to 100, g' is an integer of 2 to 100, k is 0 or 1, and a'+b'+c'+d'+e'+g' is an integer of 2 to 5,002,
the composition being free of a condensation catalyst.
2. A condensation curable resin composition comprising (C) a silphenylene skeleton-bearing organosilicon compound having a hydrogen atom and a hydroxyl and/or alkoxy group on a common silicon atom, represented by the general formula (4):

$$(R^1{}_3SiO_{0.5})_{a''}(R^4{}_2SiO)_{b''}(R^2SiO_{1.5})_{c''}(SiO_2)_{d''}Z_{e''}(O_{0.5}X)_{f''} \quad (4)$$

wherein $R^1$ is independently hydrogen or a $C_1$-$C_{12}$ unsubstituted monovalent hydrocarbon group, $R^2$ is independently a $C_1$-$C_{12}$ unsubstituted monovalent hydrocarbon group, Z is independently a group having the formula (2):

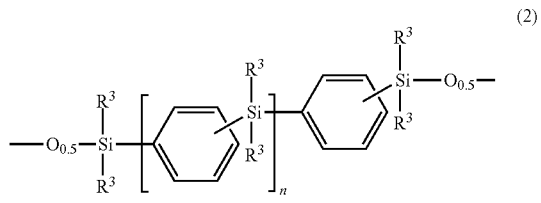

(2)

wherein $R^3$ is independently a $C_1$-$C_{12}$ unsubstituted monovalent hydrocarbon group, and n is an integer of 0 to 3, X is independently hydrogen or a $C_1$-$C_6$ unsubstituted monovalent hydrocarbon group, $R^4$ is hydrogen, a $C_1$-$C_{12}$ unsubstituted monovalent hydrocarbon group or OX, a" is an integer of 0 to 500, b" is an integer of 0 to 5,000, c" is an integer of 0 to 500, d" is an integer of 0 to 500, e" is an integer of 1 to 500, f" is an integer of 0 to 100, g" is an integer of 2 to 100, k is 0 or 1, and a"+b"+c"+d"+e"+g" is an integer of 3 to 5,003, the composition being free of a condensation catalyst.

3. The composition of claim 1, further comprising (D) an organosilicon compound having at least two hydrolyzable groups selected from acetoxy, ketoxime and alkenoxy groups per molecule or a partial hydrolyzate thereof, in an amount of 0.1 to 30 parts by weight per 100 parts by weight of components (A) and (B) combined or component (C).

4. The composition of claim 1, further comprising (E) an organosilicon compound having at least two hydroxyl and/or alkoxy groups per molecule, represented by the general formula (6):

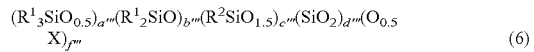

(6)

wherein $R^1$, $R^2$ and X are as defined above, a''' is an integer of 0 to 500, b''' is an integer of 0 to 5,000, c''' is an integer of 0 to 500, d''' is an integer of 0 to 500, f'' is an integer of 2 to 100, and $1 \leq b''' + c''' + d''' \leq 5,000$, in an amount of 5 to 500 parts by weight per 100 parts by weight of components (A) and (B) combined or component (C).

5. A semiconductor package encapsulated with a cured product of the condensation curable resin composition of claim 1.

* * * * *